United States Patent [19]  
Halbach

[11] Patent Number: 4,621,236  
[45] Date of Patent: Nov. 4, 1986

[54] CYLINDRICAL ELECTROMAGNET FOR AN NMR IMAGING SYSTEM

[75] Inventor: Klaus Halbach, Berkeley, Calif.

[73] Assignee: Field Effects, Inc., Acton, Mass.

[21] Appl. No.: 700,036

[22] Filed: Feb. 11, 1985

[51] Int. Cl.⁴ ............................................. G01R 33/12
[52] U.S. Cl. .................................... 324/319; 324/320; 335/299
[58] Field of Search ................ 335/299, 216; 324/318, 324/319, 320, 321, 322

[56] References Cited

U.S. PATENT DOCUMENTS

| | | | |
|---|---|---|---|
| 4,320,342 | 3/1982 | Heinzerling | 324/319 |
| 4,449,097 | 5/1984 | Young et al. | 324/309 |
| 4,456,881 | 6/1984 | Compton | 324/319 |
| 4,486,711 | 12/1984 | Frese et al. | 324/319 |

FOREIGN PATENT DOCUMENTS 2034123 10/1978 United Kingdom .

OTHER PUBLICATIONS

High Technology/Aug., 1984—NMR Promises To Keep, by Franklin H. Portugal, pp. 66–84.

NMR Tomography/Sep./1982, by William G. Bradley, pp. 86–112.

Primary Examiner—George Harris  
Attorney, Agent, or Firm—Lahive & Cockfield

[57] ABSTRACT

Disclosed is a new type of electromagnet which can be used as a gradient coil in NMR imaging systems. The cylindrical electromagnet produces a transverse magnetic field perpendicular to the magnet axis which varies as the displacement along the magnet axis. An NMR imaging system using this new magnet is also disclosed.

11 Claims, 10 Drawing Figures

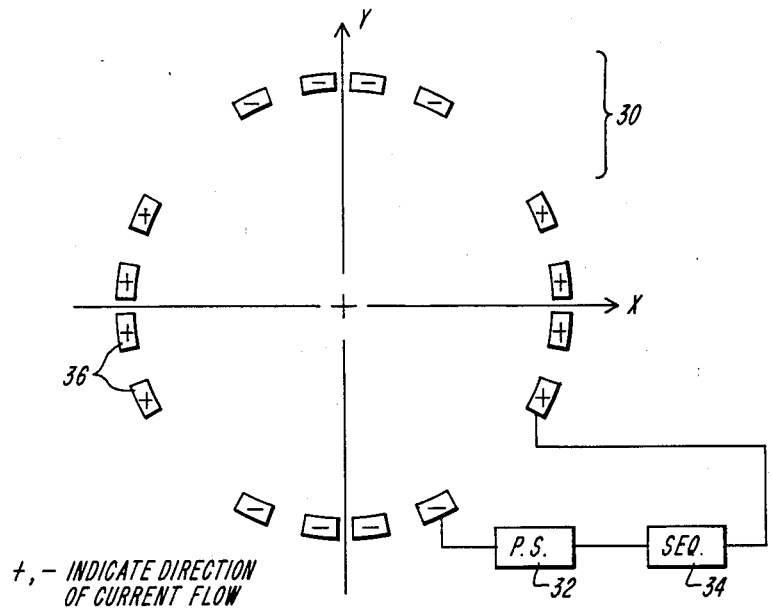
+,− INDICATE DIRECTION OF CURRENT FLOW
FIG. 3
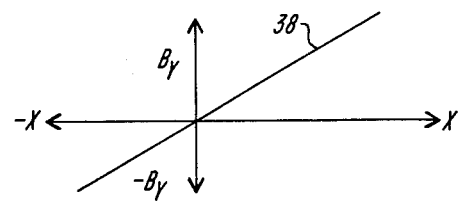
FIG. 4
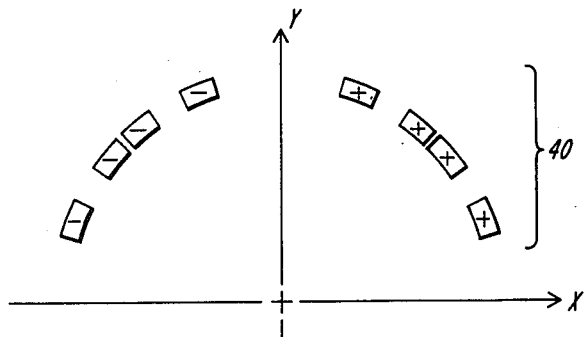
+,− INDICATE DIRECTION OF CURRENT FLOW
FIG. 5
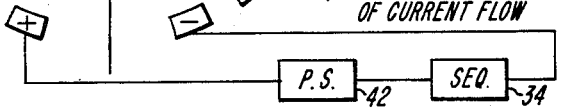
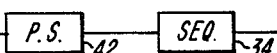

CYLINDRICAL ELECTROMAGNET FOR AN NMR IMAGING SYSTEM

BACKGROUND OF THE INVENTION

This invention relates to the design and construction of electromagnets. More particularly, the invention features a cylindrical electromagnet useful as a gradient coil for providing spatial information in nuclear magnetic resonance ("NMR") imaging systems.

Recent years have evidenced an explosion in technological advances related to health care. The computer-aided tomographic ("CAT") scanner provides a new tool for the medical profession to explore the interior of the human body without surgery. The CAT scanner uses x-rays as a probe and produces an absorption pattern which a computer reconstructs to form an image. While the CAT scanner has changed diagnostic medicine by allowing non-invasive in-depth exploration of the body, the exposure of patients to x-rays should be limited because of the potential damage caused by this high energy form of radiation. Therefore, less dangerous alternatives have been sought to replace the CAT scanner.

The search for safer alternatives to the CAT scanner led to the development of specialized NMR imaging systems for biomedical applications. The basic NMR imaging system for biomedical applications includes a bias field magnet, a series of gradient coils, an RF or radio frequency excitation magnet, a sequencer, and a receiver. NMR imaging systems are based on the interaction between the magnetic moments of nuclei, and an applied magnetic field. Currently, hydrogen nuclei are used in most NMR imaging systems but other nuclei having a net nuclear magnetic moment, e.g., phosphorus nuclei, could be used to provide additional information. The bias field magnet produces a substantially constant, preferably uniform, magnetic field, causing a shift in the direction of the magnetic moments of the hydrogen nuclei so more magnetic moments are aligned parallel to the applied field than antiparallel. The RF magnet then is turned on to produce a pulse of radio frequency fields, causing a short term perturbation of the magnetic field. The nuclei absorb energy at a frequency in this range so the magnetic moments of the nuclei are displaced from their predominately aligned orientation to a non-aligned position. This non-aligned position is a higher energy state than the aligned orientation. The RF magnet is normally pulsed for a short time, e.g., milliseconds, under control of the sequencer, and after the pulse, the field exerted by the bias magnet tends to restore the orientation of the magnetic moments of the hydrogen nuclei to the lower energy state.

The magnetic environment of the hydrogen nuclei can be determined by measuring the strength of the magnetic field at the particular location before and after the RF perturbation. The receiver, which may be the same coil as the RF magnet, is used to detect the magnetic field intensity. The information derived from the receiver can be used to determine the magnetic environment through magnetic field intensity measurements. The main discriminatory mechansim currently used is a determination of the density of the nuclei within the scanned location.

Another method of determining the magnetic environment which may become important in the future is the spin-spin relaxation time constant, $T_2$. Time constant determinations might yield more information than field intensity readings.

Conventional NMR systems, e.g., those not used for biomedical scanning, sample a minute amount of homogenous material. Because of the small size and homogeneity of the material, spatial information concerning the location of the magnetic environment causing the signal is not needed. However, the spatial location of the hydrogen nuclei producing the specific field is of tantamount importance for biomedical applications of NMR. The X, Y, and Z gradient coils of an NMR imaging system are used to perturb the bias magnetic field throughout the sample. A region within the sample, e.g., a point or plane, is left unperturbed by the field gradient. The computer uses the receiver output to identify the type and density of the nuclei in the unperturbed region, thereby identifying the material at that spatial location. The sequencer modifies the pulse duration and strength through the gradient coils as well as the RF magnet which allows the NMR imaging system to scan across the sample or patient.

One form of magnet which can be used as a gradient coil is the so-called "cosine $2\theta$" coil. Cosine $2\theta$ coils are substantially cylindrical electromagnets having a series of conductors located on the outer surface of the cylinder and extending parallel to the axis of the cylinder. Cosine $2\theta$ coils produce magnetic fields perpendicular to the cylinder axis; they cannot be used to produce magnetic fields directed in the axial or Z direction. Since solenoid-type magnets, e.g., electroresistive or superconducting magnets used in conventional NMR imaging systems produce axial fields, cosine $2\theta$ coils cannot be used as gradient coils in those systems. The Z-directional gradient on an axial magnetic field ($dB_z/dz$ where $B_z$ is the magnetic field) can be produced by a variable pitch solenoid but it is difficult to produce the desired transverse gradients, $dB_z/dx$ and $dB_z/dy$, without substantial system modifications.

The bias field produced by a cylindrical permanent magnet formed of an anisotropic magnetic material is a transverse field; that is, the field is constrained to the plane of the cylindrical magnet (by definition the Y-direction) rather than the axial or Z-direction field produced by conventional solenoid magnets. There are now some solenoid magnets which produce this type of transverse bias field. Because of the field direction, cosine $2\theta$ coils can be used to produce the requisite gradients on the transverse field in two of the three coordinate directions, specifically the X and Y gradients of the transverse or Y field. However, there are no conventional gradient coils which can produce the requisite field gradient in the axial or Z direction of the transverse ($B_y$) field.

Accordingly, an object of the invention is to provide a cylindrical electromagnet or gradient coil which produces a transverse field which varies in strength substantially linearly with displacement from a reference point in the direction parallel to the magnet axis. Another object of the invention is to produce a cylindrical electromagnet capable of producing an axial magnetic field which varies proportionally to the distance from the axis of the magnet in a direction parallel to a transverse axis. A further object of the invention is to provide an electromagnet useful as a gradient coil in an NMR imaging system. A still further object of the invention is to provide a cylindrical electromagnet which produces a transverse field with controllable variation parallel to the axis of the magnet. These and other objects and features of the invention will be apparent from the following description and the drawing.

SUMMARY OF THE INVENTION

The present invention features a cylindrical electromagnet extending about a magnet axis (by definition, the Z-axis) and having a central plane (Z=0) perpendicular to the magnet axis. The magnet produces a transverse magnetic field directed parallel to a transverse (Y) axis perpendicular to the magnet axis. The transverse magnetic field produced by the magnet of the invention varies in intensity in the direction parallel to the magnet axis with the variation being proportional to the displacement from the central plane in the Z-direction.

The magnet of the invention also produces an axial magnetic field directed parallel to the magnet axis. The axial field also varies in intensity, the variation of the axial field being proportional to the distance from the magnet axis in the direction of the transverse axis. The production of a magnetic field with a linear variations in orthogonal directions is a by-product of the symmetry of Maxwell's equations. A magnet which produces a transverse field directed parallel to the Y axis having a variation in intensity proportional to the distance from the Z=0 or X-Y plane inherently produces an associated Z-directed magnetic field which varies in intensity proportional to the distance from the Z-axis in the direction of the Y-axis.

The magnet of the invention includes a plurality of current-carrying conductors disposed such that the current density in the azimuthal direction is proportional to the sine of the azimuthal angle $\phi$. The conductors are further disposed such that the current density in the direction parallel to the magnet axis is proportional to the distance from the central or Z=0 plane in the direction of the magnet axis multiplied by the cosine of the azimuthal angle $\phi$.

Ideally, the magnet consists of a current-carrying sheet having the current density described above. This current density can be approximated by a series of current-carrying conductors linked to a single current source. In this embodiment, each conductor of the cylindrical electromagnet of the invention has a shape such that the distance of the conductor from the central plane multiplied by the sine of the azimuthal angle $\phi$ is a constant along its entire length. In an electromagnet having at least one set of N conductors, each identified by a positive integer (i), the conductors are located such that the closest approach of each of the conductors to the central plane is defined by the series (2i-1)D, where D is the distance of the closest approach of the innermost (i=1) conductor to the central plane. The closest approach positions of the conductors in a nested set are D, 3D, 5D, etc.

The invention further features a cylindrical electromagnet having four sets of current-carrying conductors. The first set of conductors is located about a first conductor axis $\phi=\pi/2$ and extends in a positive direction relative to the central plane of the cylindrical electromagnet. The second set of current-carrying conductors is located about the same first conductor axis, $\phi=\pi/2$, and extends in a negative direction relative to the central or X-Y plane. The electromagnet includes a third set of current-carrying conductors symmetrical about a second conductor axis $\phi=\pi/2$. This third set of conductors extends in a positive direction relative to the central plane. The fourth set of current-carrying conductors is also symmetrical about the second conductor axis $\phi=-\pi/2$ but extends in a negative direction relative to the central plane. The current-carrying conductors ideally extend to infinity, and in practice, they extend far enough to provide the required fields with sufficient accuracy.

The current-carrying conductors are preferably located such that they form the outer surface of the magnet of the invention but they may be supported, either on their interior or exterior surfaces, by additional structural devices.

The invention features a method of providing a magnetic field directed perpendicular to the axis of the cylindrical electromagnet producing the field. The field is parallel to a transverse (Y) axis with a variation parallel to the magnet axis such that the intensity of the magnetic field at any location is proportional to the distance from the transverse axis in the direction of the magnet (Z) axis. The method of producing the field includes the steps of locating a series of current-carrying conductors about the surface of a cylindrical electromagnet such that the current density through each of the conductors in an azimuthal direction is proportional to the sine of the azimuthal angle $\phi$ and the current density through each of the conductors in a direction parallel to the magnet axis is proportional to the displacement from the transverse axis in the direction of the magnet axis multiplied by the cosine of the azimuthal angle $\phi$.

The cylindrical electromagnet and the method of the invention are particularly useful in the design and construction of gradient coils used for NMR imaging systems. However, the electromagnet and method of the invention are applicable in any device or procedure which requires a gradient in the transverse magnetic field such that the variation is proportional to the distance from the central plane of the magnet. For example, the magnet of the invention might conceivably be used in particle accelerators for high energy physics. The method or magnets constructed pursuant to the disclosure herein may also be used in any device or system which requires that the strength of the axial magnetic field varies in proportion to the distance from the central axis of the magnet in the direction of the transverse axis.

BRIEF DESCRIPTION OF THE DRAWING

FIG. 3 illustrates the coil winding (in cross-section) of a cosine $2\theta$ useful for producing an X-gradient on a Y-directional magnetic field;

FIG. 4 illustrates the Y-component of the magnetic field produced by the electromagnet of FIG. 3 as a function of the X-displacement;

FIG. 5 illustrates the coil winding (in cross-section) of a cosine $2\theta$ coil useful for producing a Y-gradient on a Y-directional magnetic field;

DESCRIPTION OF THE ILLUSTRATED EMBODIMENT

Figure 1:
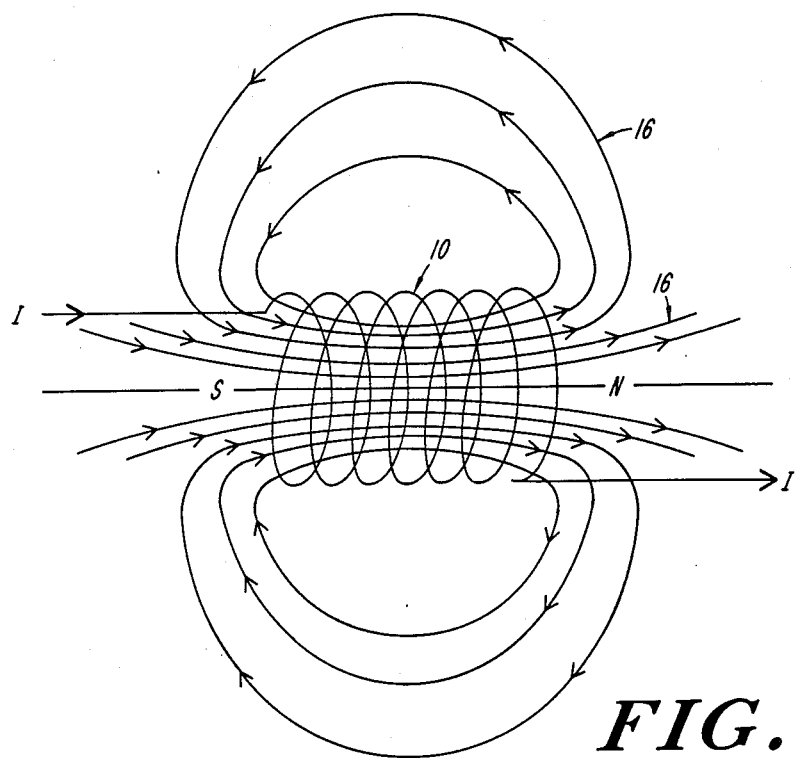
FIG. 1 illustrates a conventional solenoid magnet (such as an electroresistive or superconductive magnet) showing the resulting field pattern.

The present invention concerns a new type of cylindrical electromagnet which produces a transverse magnetic field that varies in strength proportional to the displacement in a direction parallel to the axis of the magnet from the central plane of the magnet. In other words, if the axis of cylinder of the electromagnet of the invention is defined as the Z-axis, a transverse or Y-directed field ($B_Y$) is produced which varies in strength as the distance in the Z-direction from the X-Y plane. Because of the symmetry of Maxwell's equations, the electromagnet also produces an axial field ($B_z$) such that $B_z$ at any location is proportional to the Y displacement; that is, the field in the axial direction varies in proportion to the distance from the magnet axis in the direction parallel to the transverse (Y) axis.

Magnetic fields which vary depending on their location are necessary in NMR imaging systems to produce the spatial information used in image reconstruction. By superimposing these magnetic fields upon already existing magnetic fields, gradients are set up throughout the bore of the magnet so the field is perturbed at all regions except along a specifically chosen point or plane. Using these magnets, it is possible to scan across the entire bore by varying the strength and orientation of the magnetic field produced by these gradient coils. Thus, one obtains the full spatial information needed for computer reconstruction of the properties of the materials forming the sample under investigation. The spatial information obtained from the perturbations caused by the gradient coils make it possible to differentiate materials properties in three dimensions by the response or angular displacement of the magnetic moments of specific nuclei to the applied magnetic field, e.g., a tumor may be differentiated from other surrounding tissues.

When dealing with cylindrical electromagnets, it is often convenient to work in cylindrical coordinates (R, $\phi$, Z) rather than rectangular coordinates (X, Y, Z). If one designates the magnet axis as the Z-axis, then the central plane of the magnet corresponds to the X-Y or R-$\phi$ plane. To change coordinates from one system to another, the transformations are $X = R \cos\phi$ and $Y = R \sin\phi$. Therefore, the plane Y-Z corresponds to $\phi = \pi/2$ and the plane X-Z corresponds to $\phi = 0$.

The present invention is based, in part, on the recognition that one obtains a Y-directional magnetic field ($B_y$) having a linear gradient such that the intensity of the magnetic field is proportional to the Z or axial distance from the X-Y plane if the current density meets the following equations:

$$J_\phi \Delta R = -I_o' \sin\phi \qquad (1)$$

$$J_z \Delta R = I_o' (Z/r_1) \cos\phi \qquad (2)$$

where $\Delta R$ is the radial thickness of the conductor, and $I_o'$ is a constant. Therefore, the construction of a cylindrical electromagnet having the conductors arranged in a predetermined pattern can produce the requisite magnetic field to be produced. Briefly, these equations state that the current density in the azimuthal direction ($J_{100}$) is proportional to the sine of the azimuthal angle $\phi$ and that the current density in the axial or Z direction ($J_z$) is proportional to the cosine of the azimuthal angle $\phi$ times the distance from the X-Y or R-$\phi$ plane.

An examination of these equations leads to the conclusion that the field can be produced by current-carrying conductors if the conductors are laid out according to equation 3:

$$Z \sin\phi = Z_i \qquad (3)$$

This equation describes a series of curves about the plane $Z = 0$ and having a closest approach $Z_i$. If the same current is applied to each current-carrying conductor, e.g., the conductors are linked to a single current supply, the current density requirements of equations 1 and 2 will be met by current-carrying conductors laid out symetrically about the planes $\phi = \pi/2$ and $\phi = -\pi/2$ with $Z_i = (2i-1)D$ where D is the closest approach position for the innermost conductor and i is an integer greater than or equal to 1. Each conductor will have a different closest approach position.

FIG. 1 illustrates a conventional electroresistive or superconductive electromagnet in the shape of a solenoid 10. Solenoid 10 is connected to a power supply (not illustrated) which produces a current I through conductors 10. The large arrows on solenoid 10 show the direction of the current I. Passage of current I through solenoid 10 induces the magnetic field, illustrated as field lines 16. The small arrows show the direction of the induced magnetic field. The field is mainly axial or essentially parallel to the Z-axis throughout the bore of the magnet. This type of magnet is used as the bias field magnet in conventional NMR imaging systems. Because the primary field is in the Z-direction, the gradients which are of interest are the $dB_z/dx$, $dB_z/dy$ and $dB_z/dz$.

Figure 2:
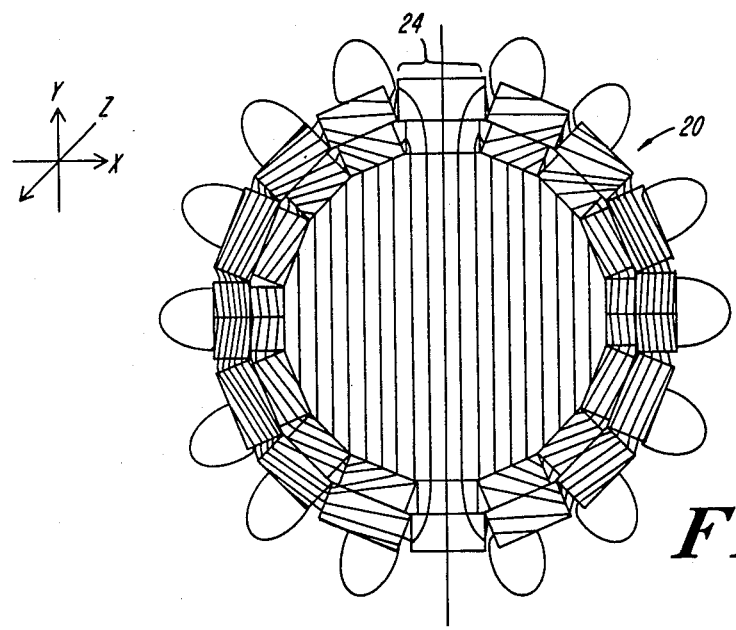
FIG. 2 illustrates a cylindrical magnet constructed of a permanent, anisotropic magnetic material and the resulting field pattern.

A recent development in NMR imaging systems is the use of permanent anisotropic material to form the bias magnet. A segmented magnet formed of a permanent magnetic anisotropic material can produce a substantially uniform transverse or Y-directional field. Because the bias field is in the Y rather than the Z direction, the gradients of importance are $dB_y/dx$, $dB_y/dy$ and $dB_y/dz$. FIG. 2 illustrates cylindrical permanent bias magnet 20 formed of sixteen segments 24 useful for NMR imaging systems. The Y-directional magnet field is illustrated by pattern 22.

FIG. 3 illustrates a cross-sectional view of a cosine $2\theta$ gradient coil 30 that produces a Y-directed field which varies in intensity proportional to the X-displacement ($dB_y/dx$). Gradient coil 30 has a power supply 32 which is connected a sequencer 34 and a series of axial conductors 36. Sequencer 34 can turn power supply 32 on and off, causing current to pass through axial conductors 36, thereby creating the magnetic field. The "+" and "−" signs indicate opposite current directions.

FIG. 4 illustrates the magnetic field 38 produced by the gradient coil illustrated in FIG. 3. FIG. 4 shows the $dB_y/dx$ field produced; that is, the field is in the Y-direction with a variation in intensity such that the field strength increases as the X-distance increases. As noted previously, production of a $dB_y/dx$ gradient, one of the gradients necessary with a bias magnet producing a Y-directed magnetic field, necessitates the production of a $dB_x/dy$ gradient field because of the symmetry of Maxwell's equations. However, the $dB_x/dy$ gradient is not a problem in obtaining the requisite spatial information and can be ignored.

FIG. 5 illustrates a cross-sectional view of a cosine $2\theta$ gradient coil 40 producing a Y-directed field which varies in intensity proportional to the Y-position ($dB_y/dy$). Gradient coil 40 is identical to gradient coil 30 except the axial conductors 46 are rotated 45° in the $\phi$ direction about the Z-axis. Gradient coil 40 is connected to a sequencer which can be sequencer 34; that is, one sequencer may be used to control the current and therefore the magnet fields produced by the RF magnet and all the gradient coils. Gradient coil 40 is connected to a power supply 42 which can be the same as power supply 32; however, separate power supplies normally are used. The field produced is a Y-directed magnetic field with a variation such that the field increases with increasing Y-displacement from the X-Z plane. As shown in FIG. 5, the "+" and "−" signs indicate opposite current directions.

Figure 6:
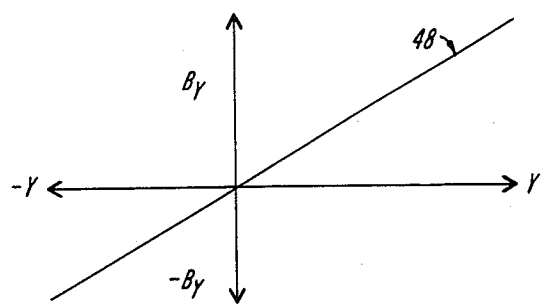
FIG. 6 illustrates the Y-component of the magnetic field produced by the electromagnet of FIG. 5 as a function of the Y-displacement.

FIG. 6 illustrates the magnetic field 48 produced by gradient coil 40 as a function of the displacement along the Y-axis.

As noted, NMR imaging systems using permanent anisotropic magnetic material such as the magnet illustrated in FIG. 2 can have a Y-direction bias field. The conventional cosine $2\theta$ coils, as illustrated in FIGS. 3 and 5, can be used to produce the $dB_y/dx$ and $dB_y/dy$ gradients but cannot be used to produce the $dB_y/dz$ gradient field needed in this geometry.

Figure 7:
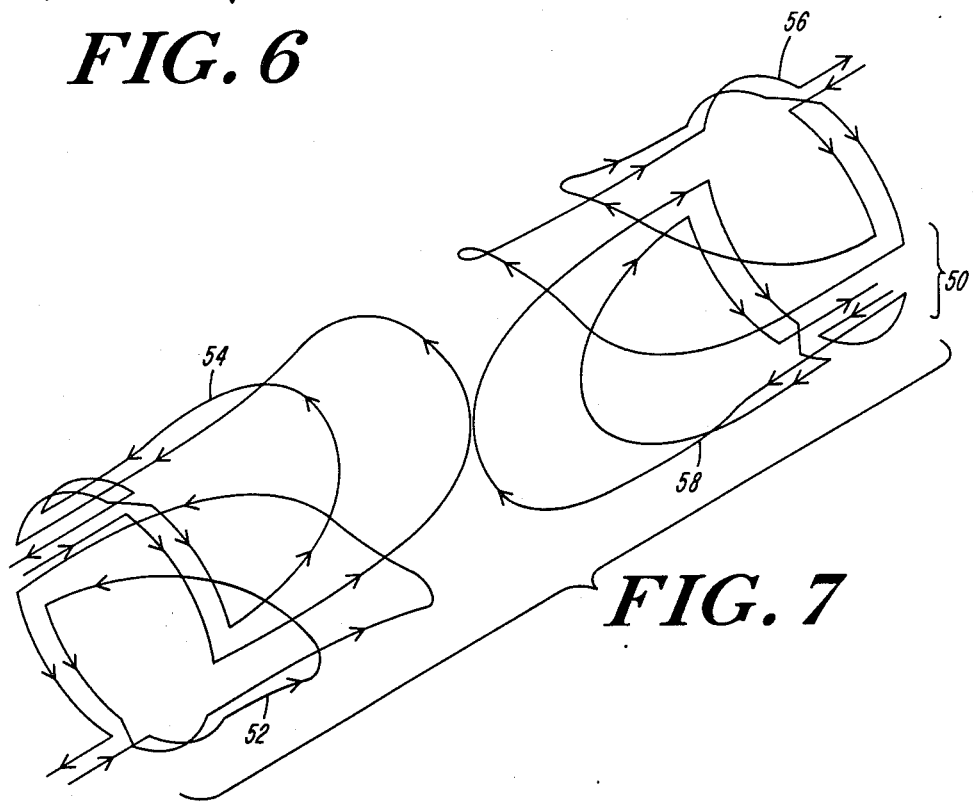
FIG. 7 illustrates a cylindrical electromagnet of the invention, shown with eight conductors, useful for producing a Z-gradient on a Y-directional magnetic field.

FIG. 7 illustrates a cylindrical electromagnet of the present invention which can be used as a gradient coil with either conventional electrosolenoid bias magnets or permanent anisotropic magnetic material bias magnets. In this embodiment, cylindrical electromagnet 50 has four sets of conductors 52, 54, 56 and 58 on its surface but the invention is not limited to a four conductor mode. Coils 52, 54, 56 and 58 are symmetric about the Y-Z plane. The arrows on conductors 52, 54, 56 and 58 show the direction of the current through each conductor. The coils are all to be connected to a single current supply. An electromagnet with this pattern of current-carrying conductors produces a Y-directional magnetic field which varies linearly with the Z-position ($dB_y/dz$) as well as a Z-directional magnetic field varies linearly with the Y-position ($dB_z/dy$).

Figure 8:
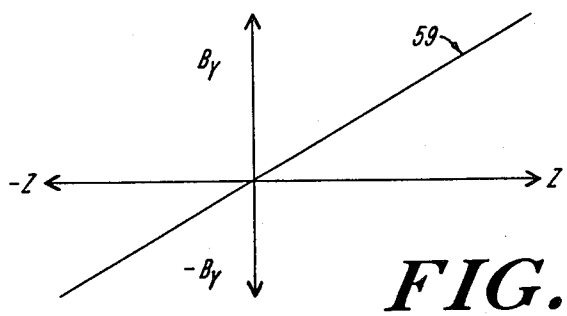
FIG. 8 illustrates the Y-component of the magnetic field produced by the electromagnet of FIG. 7 as a function of the Z-displacement.

FIG. 8 illustrates the Y-component of the gradient field 59 produced by the gradient coil of FIG. 7 as a function of the Z-displacement.

Figure 9:
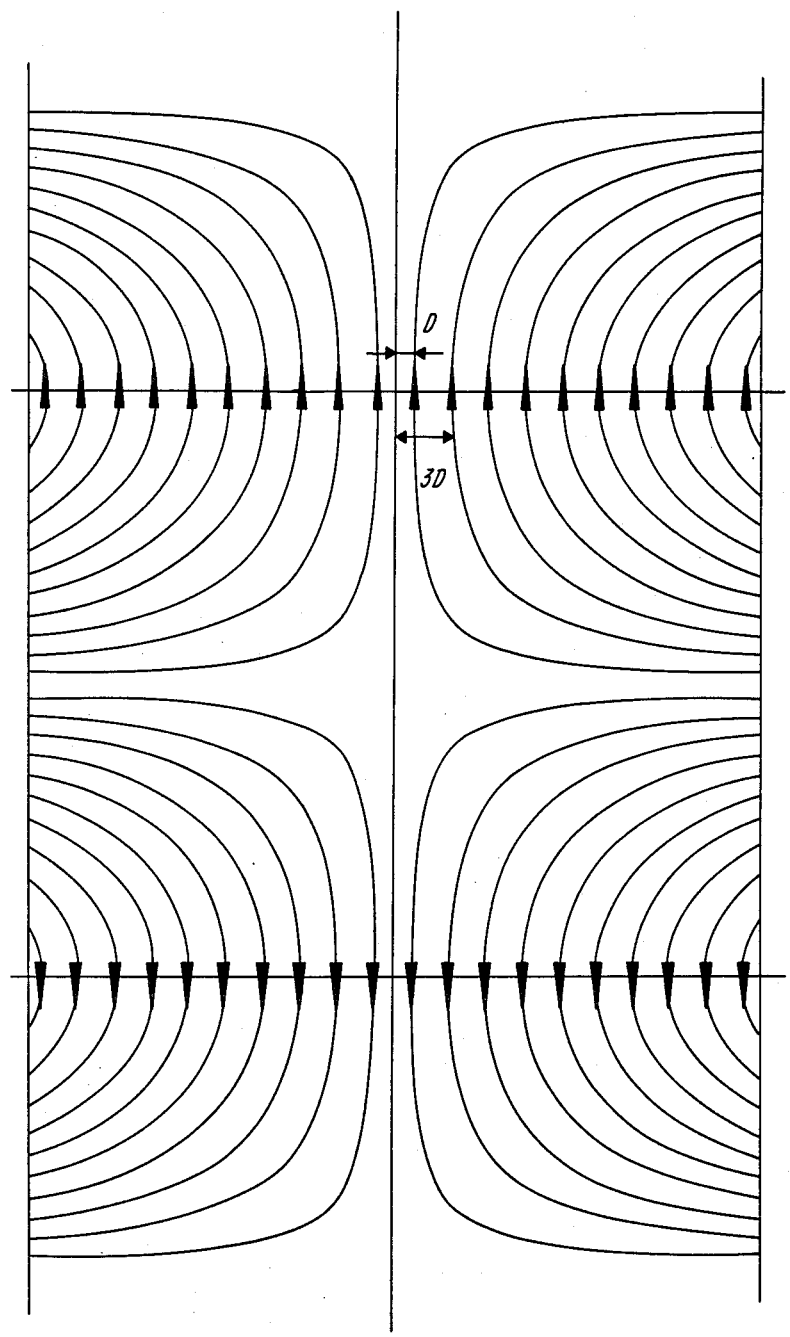
FIG. 9 illustrates the shape of the windings of a cylindrical electromagnet of the invention when they are unrolled onto a plane.

FIG. 9 shows the electromagnet of FIG. 7 projected into a two dimensional plane by cutting the magnet along the plane $\phi=\pi$ (or $-\pi$). This format illustrates that conductor sets 52 and 54 are symmetrical about the axis $\phi=\pi/2$ while conductor sets 56 and 58 are symmetrical about the axis $\phi=-\pi/2$. All of the conductors are asymptotic to the planes $\phi=0$ or $\phi=\pi$ and are located at equal distances about the X-Y plane which projects in this two dimensional representation as a line $Z=0$. As illustrated by the arrows on the conductors, the current flows in the opposite direction in each set pair of conductors. Therefore, the current density is the same as the layout of conductors and is symmetric about the X-Y ($Z=0$) plane. The conductors closest approach to $Z=0$ are D, 3D, 5D, etc.

Since an NMR imaging system needs gradient coils for each spatial orientation, the advantages of the use of the electromagnet disclosed herein as a gradient coil are obvious. If a conventional electrosolenoid magnet is used as the bias field magnet, two cylindrical electromagnets of the present invention can produce the requisite X and Y gradiants on the $B_z$ field ($dB_z/dx$ and $dB_z/dy$). The associated production of gradients in the Z components of the $B_x$ and $B_y$ fields ($dB_x/dz$ and $dB_y/dz$) are not important in that type of system and can be ignored. If the bias field is supplied by a permanent magnet made of an anisotropic magnetic material or a modified electrosolenoid producing a bias field directed in a transverse (Y) rather than an axial (Z) direction, two cosine $2\theta$ gradient coils can be used to supply the X and Y components of the Y field ($dB_y/dx$ and $dB_y/dy$) and one of the cylindrical electromagnets of the present invention can be used to supply the gradient in Z-component of the Y-field ($dB_y/dz$).

Figure 10:
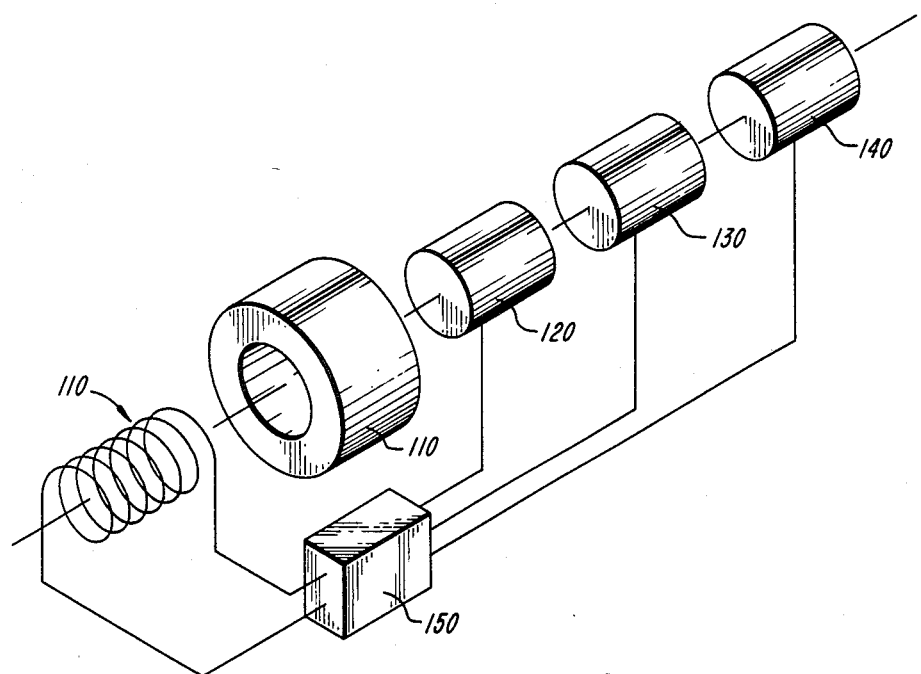
FIG. 10 illustrates an NMR imaging system having the improved electromagnet of the invention as a Z-gradient coil.

FIG. 10 represents another embodiment of the invention, an NMR imaging system having the improved gradient coil of the invention. The NMR system includes a bias field magnet 100, an RF coil 110 which also acts as a receiver, X, Y, and Z gradient coils 120, 130, and 140 respectively, and a sequencer 150. Bias field magnet 100 is formed such that it produces a Y-directed field. In this system, e.g., coils 120 and 130 are substantially similar to gradient coils 30 and 40, respectively, being conventional cosine $2\theta$ coils, while gradient coil 140 is a cylindrical electromagnet of the invention. Alternatively, if the bias magnet produces an axial field, a variable pitch solenoid could be used to supply the $dB_z/dz$ gradient while two electromagnets of the invention could supply the $dB_z/dx$ and $dB_z/dy$ gradients.

In operation, the sample or body is placed within the bore of the magnet where it is subjected to the bias field. The bias field causes an alignment of the specific nuclei within the sample or body tissue such that the dipole moment of the majority of the nuclei are parallel to the applied bias field. The sequencer then turns on the RF or radio frequency magnet for a short time period which perturbs the magnetic moments of the specific nuclei away from their aligned position. The sequencer also turns on the gradient coils in proper sequence to supply information about the strength and direction of the magnetic field at various spatial positions throughout the bore of the magnet. The properties of the material at that location may be determined by measuring the field intensity.

As previously noted, the electromagnet of the invention might also have other uses such as use in particle accelerators or magnetic guides. The electromagnets described herein are illustrative, and modifications and variations may be made. For example, by putting different currents through different conductors in a set, the spacing can be modified to approximate the same current density as is obtained by using a single current generator and the preferred spacing. In like manner, although all of the magnets discussed have been described in terms of X, Y, Z or R, $\phi$, Z coordinates, it is possible to modify the angle or orientation of the magnet to create other effects.

Those skilled in the art may determine other modifications of the magnets and methods disclosed herein. Such modifications and variations are within the scope of the following claims.

What is claimed is:

1. A cylindrical electromagnet having a central plane and extending about a magnet axis perpendicular to said central plane, said magnet producing a transverse magnetic field directed parallel to a transverse axis which is perpendicular to said magnet axis, the variation of said transverse magnetic field in the direction parallel to said magnet axis being proportional to the distance from said central plane in the direction of said magnet axis, said magnet also producing an axial magnetic field directed parallel to said magnet axis, the variation of said axial field being proportional to the distance from said magnet axis in the direction of said transverse axis, said magnet comprising a plurality of current-carrying conductors disposed such that the current density in each of said conductors in an azimuthal direction is proportional to the sine of the azimuthal angle $\phi$, and said conductors being further disposed such that the current density in each of said conductors in the direction along said magnet axis is proportional to the distance from said central plane along said magnet axis multiplied by the cosine of the azimuthal angle $\phi$.

2. The electromagnet of claim 1 wherein each of said conductors has a shape such that the distance of said conductor from said central plane multiplied by the sine of the azimuthal angle $\phi$ is a constant.

3. The electromagnet of claim 2 wherein each of said conductors, identified by a positive integer i, is located such that the closest approach of each conductor i to said central plane is defined by the series $(2i-1)D$ where D is a distance of closest approach of the conductor $i=1$ to said central plane.

4. The electromagnet of claim 1 having four sets of current-carrying conductors, the first set of current-carrying conductors located about a first conductor axis $\phi=\pi/2$ and extending in a positive direction relative to said central plane of said cylinder, a second set of current carrying conductors located about said first conductor axis and extending in a negative direction relative to said central plane, a third set of conductors located about a second conductor axis $\phi=-\pi/2$ and extending in a positive direction relative to said central plane, and a fourth set of current carrying conductors located about said second conductor axis and extending in a negative direction relative to said central plane.

5. The electromagnet of claim 1 wherein said conductors are located on the surface of said cylinder.

6. A method of providing a transverse magnetic field directed parallel to a transverse axis which is perpendicular to a magnet axis of a cylindrical electromagnet, said transverse field varying in the direction of said magnet axis such that the variation of said transverse magnetic field is proportional to the distance from said central plane in the direction of said magnet axis, said method comprising the steps of locating a plurality of current-carrying conductors on the surface of said cylindrical electromagnet, said current-carrying conductors oriented such that the current density in each of said conductors in an azimuthal direction is proportional to the sine of the azimuthal angle $\phi$, and further orienting said current-carrying conductors such that the current density in each of said conductors in the direction along said magnet axis is proportional to the distance from said central plane along said magnet axis multiplied by the cosine of the azimuthal angle $\phi$.

7. The method of claim 6 comprising the additional step of shaping said conductors so that the distance of each element of said conductors from said central plane multiplied by the sine of the azimuthal angle $\phi$ is a constant characterizing each conductor.

8. The method of claim 7 wherein each of said conductors, identified by a positive integer i, is located such that the closest approach of each conductor i to said central plane is defined by the series $(2i-1)D$ where D is the distance of closest approach of the $i=1$ conductor to said central plane.

9. In an NMR imaging system comprising a bias magnet, an RF magnet, X, Y and Z gradient coils, and a sequencer, the improvement wherein at least one of said gradient coils is a cylindrical electromagnet comprising a plurality of current-carrying conductors disposed such that the current density in each of said conductors in an azimuthal direction is proportional to the sine of the azimuthal $\phi$, and said conductors being further disposed such that the current density in each of said conductors in the direction along said magnet axis is proportional to the distance from said central plane along said magnet axis multiplied by the cosine of the azimuthal angle $\phi$.

10. An NMR system wherein said bias magnet comprises an electrosolenoid magnet and said X and Y gradient coils comprising cylindrical electromagnets as defined in claim 9.

11. An NMR system wherein said bias magnet comprises a permanent anisotropic material and said Z gradient coil comprises a cylindrical electromagnet as defined in claim 9.

* * * * *